(12) United States Patent
Shin et al.

(10) Patent No.: US 12,732,207 B2
(45) Date of Patent: Sep. 8, 2026

(54) LOSSY TENSOR COMPRESSION METHOD USING NEURAL NETWORK-BASED TENSOR-TRAIN DECOMPOSITION

(71) Applicants: Korea Advanced Institute of Science and Technology, Daejeon (KR); Foundation of Soongsil University-Industry Cooperation, Seoul (KR)

(72) Inventors: Kijung Shin, Daejeon (KR); Taehyung Kwon, Daejeon (KR); Jihoon Ko, Daejeon (KR); Jinhong Jung, Seoul (KR)

(73) Assignees: Korean Advanced Institute of Science and Technology, Daejeon (KR); Foundation of Soongsil University-Industry Cooperation, Seoul (KR)

( * ) Notice: Subject to any disclaimer, the term of this patent is extended or adjusted under 35 U.S.C. 154(b) by 93 days.

(21) Appl. No.: 18/904,499

(22) Filed: Oct. 2, 2024

(65) Prior Publication Data

US 2025/0240028 A1 Jul. 24, 2025

(30) Foreign Application Priority Data

Jan. 24, 2024 (KR) ........................ 10-2024-0010698

(51) Int. Cl.

| | |
|---|---|
| ***H03M 7/30*** | (2006.01) |
| *G06N 3/0442* | (2023.01) |
| *G06N 3/0495* | (2023.01) |

(52) U.S. Cl.
CPC ....... *H03M 7/3059* (2013.01); *H03M 7/3077* (2013.01); *H03M 7/6011* (2013.01); *G06N 3/0442* (2023.01); *G06N 3/0495* (2023.01)

(58) Field of Classification Search
CPC ............ H03M 7/3059; H03M 7/3077; H03M 7/6011; G06N 3/0495; G06N 3/0442
See application file for complete search history.

(56) References Cited

FOREIGN PATENT DOCUMENTS

| | | | | |
|---|---|---|---|---|
| CN | 120373358 A | * | 7/2025 | ............ G06N 3/045 |
| JP | 2021184225 A | | 12/2021 | |
| WO | 2022079815 A1 | | 4/2022 | |
| WO | 2022251317 A1 | | 12/2022 | |
| WO | 2023198817 A1 | | 10/2023 | |

OTHER PUBLICATIONS

Japanese Notice of Reasons for Refusal mailed on Sep. 2, 2025, issued in Japanese Application No. 2024-158753; 10 pages.

(Continued)

*Primary Examiner* — Joseph J Lauture
(74) *Attorney, Agent, or Firm* — IPkey PLLC

(57) ABSTRACT

Disclosed is a lossy tensor compression method using neural tensor-train decomposition (NTTD). A lossy tensor compression method performed by a computer system may include inputting, to a neural tensor-train decomposition (NTTD) model, mode indices of a target entry to be reconstructed, and obtaining tensor-train (TT) cores from the mode indices of the target entry to be reconstructed through the NTTD model.

10 Claims, 7 Drawing Sheets

(56) References Cited

OTHER PUBLICATIONS

Kwon, T., "TensorCodec: Compact Lossy Compression of Tensors without Strong Data Assumptions." TensorCodec/model.py [online] Jul. 7, 2023 <https://github.com/kbrother/TensorCodec/>.

Korean Office Action mailed on Jul. 21, 2025, issued in Korean Application No. 10-2024-0010698, filed on Jan. 24, 2024; 8 pages.

Kwon, T. "NeuKron: Constant-Space Lossy Compression of Sparse Reorderable Matrices," Master's Thesis (2022), Korea Advanced Institute of Science and Technology; 32 pages.

Wang, D. et al., "Compressing 3DCNNs based on tensor train decomposition," Elsevier: Neural Networks 131 (2020) 215-230.

* cited by examiner

FIG. 5

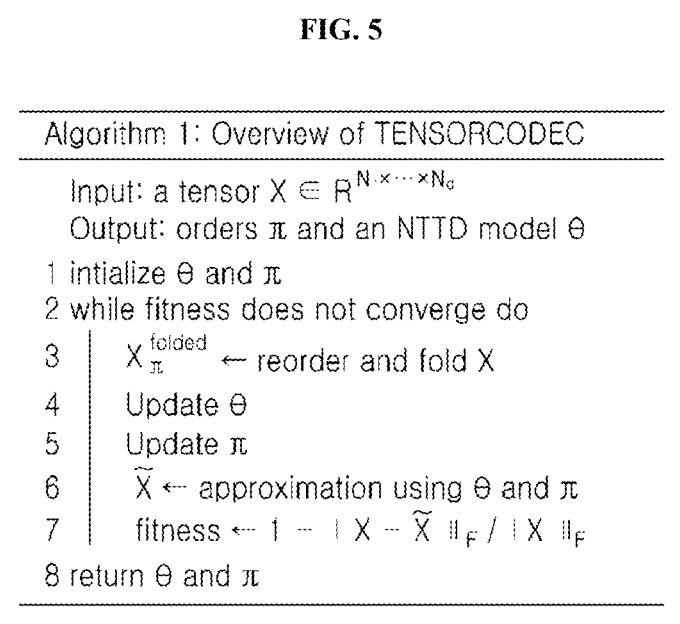

Algorithm 1: Overview of TENSORCODEC

Input: a tensor $X \in R^{N_1 \times \cdots \times N_d}$
Output: orders $\pi$ and an NTTD model $\theta$ 1 intialize $\theta$ and $\pi$
2 while fitness does not converge do
3 $X_{\pi}^{folded} \leftarrow$ reorder and fold X
4 Update $\theta$
5 Update $\pi$
6 $\widetilde{X} \leftarrow$ approximation using $\theta$ and $\pi$
7 fitness $\leftarrow 1 - \| X - \widetilde{X} \|_F / \| X \|_F$
8 return $\theta$ and $\pi$

FIG. 6

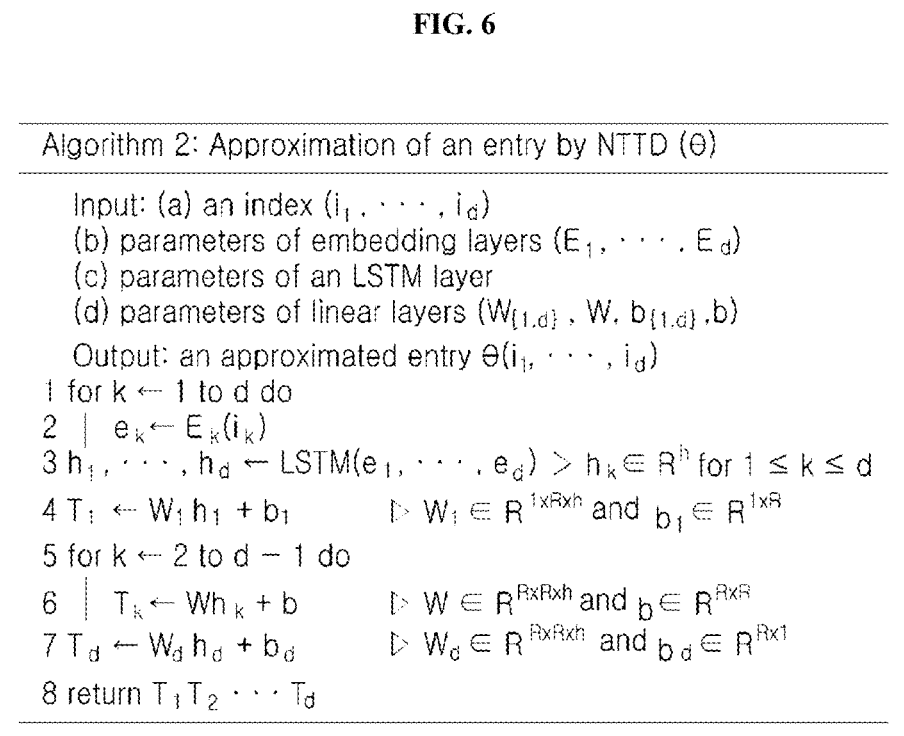

Algorithm 2: Approximation of an entry by NTTD ($\Theta$)

Input: (a) an index ($i_1, \cdots, i_d$)
(b) parameters of embedding layers ($E_1, \cdots, E_d$)
(c) parameters of an LSTM layer
(d) parameters of linear layers ($W_{\{1,d\}}$, $W$, $b_{\{1,d\}}$, $b$)

Output: an approximated entry $\Theta(i_1, \cdots, i_d)$ 1 for $k \leftarrow 1$ to $d$ do
2 | $e_k \leftarrow E_k(i_k)$
3 $h_1, \cdots, h_d \leftarrow \text{LSTM}(e_1, \cdots, e_d)$ ▷ $h_k \in R^h$ for $1 \le k \le d$
4 $T_1 \leftarrow W_1 h_1 + b_1$ ▷ $W_1 \in R^{1xRxh}$ and $b_1 \in R^{1xR}$
5 for $k \leftarrow 2$ to $d-1$ do
6 | $T_k \leftarrow W h_k + b$ ▷ $W \in R^{RxRxh}$ and $b \in R^{RxR}$
7 $T_d \leftarrow W_d h_d + b_d$ ▷ $W_d \in R^{RxRxh}$ and $b_d \in R^{Rx1}$
8 return $T_1 T_2 \cdots T_d$

FIG. 7

Algorithm 3: Update of the reordering functions π

```
Input: (a) a tensor X ∈ R^{N_1 x...x N_d}, (b) a NTTD model θ,
(c) orders π_1, · · · , π_d
Output: updated orders π_1, · · · , π_d

for k ← 1 to d do
    // Project each slice
    I ← ∅
    for j ← 0 to N_k − 1 by 2 do
        u ~ U(0, 1)
        if u < 1/2 then I ← I ∪ {j} else I ← I ∪ {j + 1}
    s ← (∏_{i=1}^{d} N_i) / N_k ; P ← ∅
    r ← a random point from R^s
    foreach j ∈ I do
        v ← vec(X^(k)(j))
        P[j] ← r · v/(‖r‖_F ‖v‖_F)
    // Hash points to buckets
    num buckets ← ⌊N_K/8⌋
    bs ← ⌊(max(P) − min(P))/num buckets⌋; B ← ∅
    foreach j ∈ I do
        bi ← ⌊(P[j] − min(P))/bs⌋
        B[bi] ← (B[bi] ∪ {j})
    // Build pairs (run in parallel)
    S ← ∅; S′ ← ∅
    foreach b ∈ B do
        AddPairs(b, S, True)          ▷ Defined below
        S′ ← S′ ∪ b
    S′ ← S′ ∪ {j ⊕ 1 : j ⊂ S′}
    AddPairs(S′, S, False)
    // Update orders (run in parallel)
    foreach (i, i′) ∈ S do
        Δ ← change in the loss when π_k(i), π_k(i′) are
            exchanged
        if Δ < 0 then π_k(i), π_k(i′) ← π_k(i′), π_k(i)
return π_1, · · · , π_d
Function AddPairs(C, S, xor)
    while |C| > 1 do
        Randomly sample (i_1, i_2) from C
        if xor then S ← S ∪ {(i_1, i_2 ⊕ 1)} ∪ {(i_1 ⊕ 1, i_2)}
        else S ← S ∪ {(i_1, i_2)}
        C ← C \ {i_1, i_2}
```

LOSSY TENSOR COMPRESSION METHOD USING NEURAL NETWORK-BASED TENSOR-TRAIN DECOMPOSITION

CROSS-REFERENCE TO RELATED APPLICATION

This application is based on and claims priority under 35 U.S.C. 119 to Korean Patent Application No. 10-2024-0010698, filed on Jan. 24, 2024 in the Korean intellectual property office, the disclosures of which are herein incorporated by reference in their entireties.

TECHNICAL FIELD

The following description relates to a lossy tensor compression method.

BACKGROUND OF THE DISCLOSURE

A tensor is a high-dimensional array. A cost for storing tensors is proportional to the number of entries of the tensors, which is a value that is obtained by multiplying all lengths in each dimension. When a tensor becomes a high dimension or the length of one dimension increases, a cost for storing the tensor is easily increased. Accordingly, a technology that compresses the tensor is essential.

Among methods of compressing a matrix and a tensor having a large size, tensor-train decomposition (TTD) is now the center of attraction. However, the TTD has low accuracy due to the limit of expressiveness. Deep learning models have excellent performance in the ability to approximate arbitrary functions. Among them, in the case of a problem having permutation as its input, a recurrent neural network is widely used.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Embodiments may provide a lossy tensor compression method and system having a low error when reconstructing a tensor while compressing the tensor small by applying tensor-train decomposition (TTD) and a recurrent neural network.

In an embodiment, a lossy tensor compression method performed by a computer system may include inputting, to a neural tensor-train decomposition (NTTD) model, mode indices of a target entry to be reconstructed, and obtaining tensor-train (TT) cores from the mode indices of the target entry to be reconstructed through the NTTD model.

The NTTD model may be constructed for tensor-train decomposition (TTD) by using a recurrent neural network.

The NTTD model may be constructed through searching an embedding layer for embedding in order to encode each mode index, obtaining hidden embedding for the searched embedding through an LSTM layer, generating the TT cores from the obtained hidden embedding through a linear layer, and learning to return an approximated entry value through a product of the generated TT cores.

The obtaining of the hidden embedding may include searching for compression data composed of parameters of the NTTD model and reordering functions.

The obtaining of the hidden embedding may include initializing parameters of the NTTD model and reordering functions, generating a tensor having an order of a preset reference or more by reordering an order of input tensors and folding the input tensors, and updating the parameters of the NTTD model and the reordering functions in order to minimize an approximation error.

The obtaining of the hidden embedding may further include performing a process of folding the input tensor into a tensor having the order of the preset reference or more in order to reduce a compression size of the tensor.

The obtaining of the hidden embedding may further include reordering the input tensors before performing the process of folding.

The obtaining of the hidden embedding may include reordering mode indices of the input tensors so that entries having similar values are located closely by sharing the mode indices of the folded tensor.

In an embodiment, there is provided a computer-readable recording medium in which a computer program for executing a lossy tensor compression method performed by a computer system has been stored. The lossy tensor compression method may include inputting, to a neural tensor-train decomposition (NTTD) model, mode indices of a target entry to be reconstructed, and obtaining tensor-train (TT) cores from the mode indices of the target entry to be reconstructed through the NTTD model.

In an embodiment, a computer system may include memory and a processor connected to the memory and configured to execute at least one instruction stored in the memory. The processor inputs, to a neural tensor-train decomposition (NTTD) model, mode indices of a target entry to be reconstructed and obtains tensor-train (TT) cores from the mode indices of the target entry to be reconstructed through the NTTD model.

The lossy tensor compression method according to embodiments of the present disclosure can improve performance in two aspects of a compression size and a reconstruction error compared to a conventional technology. Furthermore, the lossy tensor compression method exhibits excellent scalability because the compression time of the algorithm is linearly increased according to the number of elements of a tensor. Furthermore, it was found that reordered results were matched with geographical information in a mode including place information through case studies using traffic information datasets.

DESCRIPTION OF THE DRAWINGS

The foregoing aspects and many of the attendant advantages of this disclosure will become more readily appreciated as the same become better understood by reference to the following detailed description, when taken in conjunction with the accompanying drawings, wherein:

FIG. 5 is an algorithm for describing an overall operation of lossy tensor compression in an embodiment.

FIG. 6 is an algorithm for describing an LSTM-based compression model that generalizes TTD in an embodiment.

FIG. 7 is an algorithm for describing an operation of updating a reordering function in an embodiment.

DETAILED DESCRIPTION

While illustrative embodiments have been illustrated and described, it will be appreciated that various changes can be made therein without departing from the spirit and scope of the disclosure.

Hereinafter, embodiments are described in detail with reference to the accompanying drawings.

It is important for a lossy compression algorithm to have a small size of compressed data. Furthermore, an error of an original tensor needs to be small when the tensor is reconstructed from the compressed data. The compression algorithm is designed in order to achieve the two objects as much as possible. Furthermore, the scalability of the compression algorithm needs to be excellent even in a large tensor so that the compression algorithm can be performed. It may be determined that when the time taken for compression is proportional to the number of elements of the tensor, the scalability of the compression algorithm is excellent.

The existing lossy tensor compression algorithm requires assumption for a tensor in order to better compress the tensor. For example, tensor decomposition methods each assume that input tensors can be expressed with a low error in a low-rank structure that is defined by each tensor decomposition method. Video and image compression technologies require assumption that values stored in tensors are smoothly changed along their axes. An algorithm has been specified for a sparse matrix in which most of elements are 0. However, many tensor data that express real-world data do not follow such assumption. Accordingly, there is a need for a common algorithm having good compression performance while not requiring the assumption for a tensor.

In an embodiment, a strong lossy compression algorithm having a small compression size and a low reconstruction error while not requiring the assumption for a tensor and capable of compressing even a large tensor is described.

Figure 1:
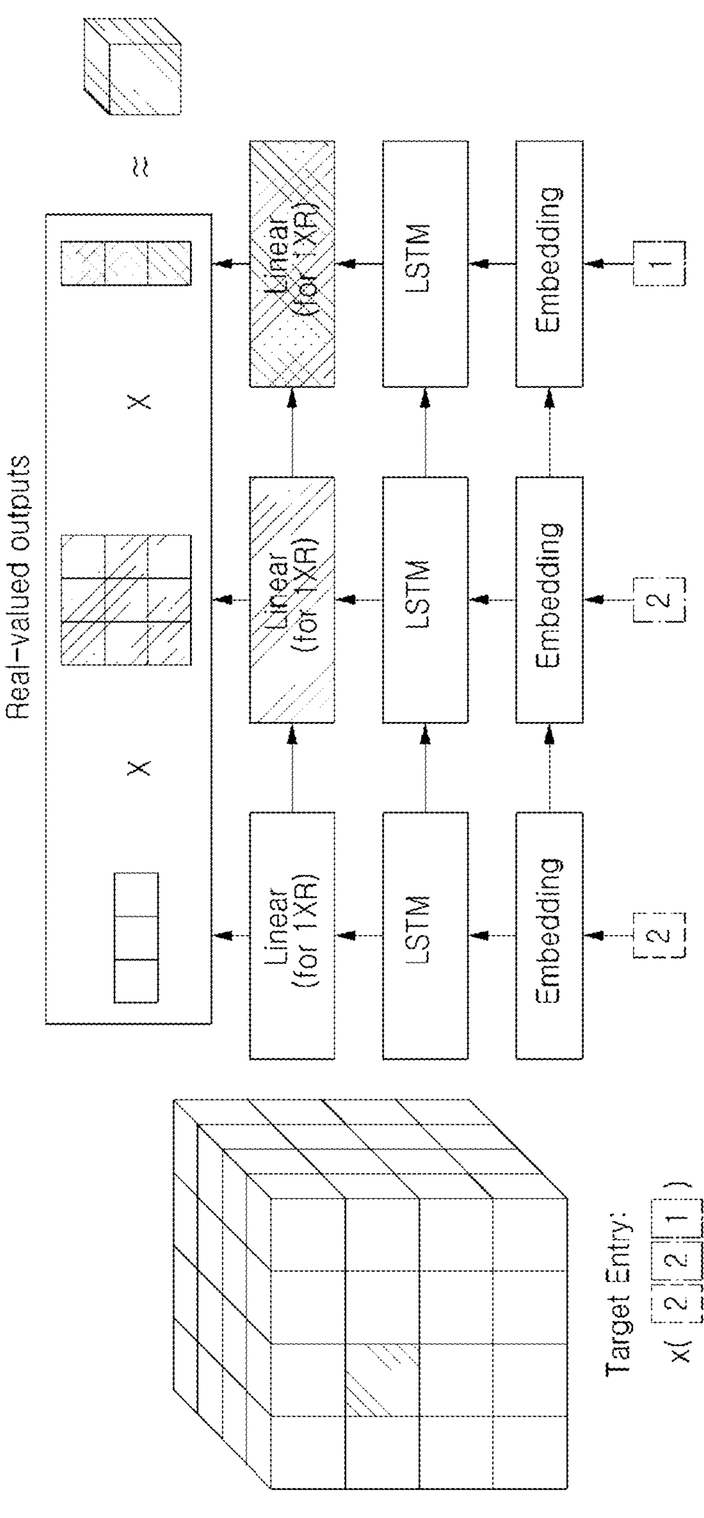
FIG. 1 is a diagram for describing a neural tensor-train decomposition (NTTD) operation in an embodiment.

FIG. 1 is a diagram for describing a neural tensor-train decomposition (NTTD) operation in an embodiment.

A computer system may provide neural tensor-train decomposition (NTTD). The computer system may use a neural network to generalize tensor-train decomposition (TTD) in order to improve expressiveness and to reduce limits attributable to low-rank assumption. The computer system may construct an NTTD model for TTD by using a neural network. The computer system uses a recurrent neural network to obtain matrices so that the matrices are dependent on the other mode indices of entries, unlike the existing TTD in which tensor core matrices are fixed by the index of each dimension. The NTTD model may approximate input tensors by using the limited number of parameters although the input tensors follow a high dimension structure. Furthermore, the computer system can reduce a space that is necessary for the NTTD model by folding the input tensors as high-dimensional tensors. Accordingly, the number of parameters that is necessary for the NTTD model can be further reduced. Finally, the computer system may uncover patterns which may be used in the NTTD model for improved approximation by reordering the mode indices of the input tensors.

A basic concept of lossy tensor compression is first described in order to help understanding of the lossy tensor compression.

Matrix and tensor: We denote matrices in boldface capital letters. If a real-valued matrix M having a size $N_1 \times N_2$ is given, an entry located in an i-th row and j-th column is denoted by M (i, j). The order of a tensor refers to the number of modes. Let $\mathcal{X}$ be a dimension order tensor having a size $N_1 \times \ldots \times N_d$. An entry at the $(i_1, \ldots, i_d)$-th position of $\chi$ is denoted by z,900 $(i_1, \ldots, i_d)$.

Slicing and reordering tensor: For a mode-j index $i \in [N_j]$, $\mathcal{X}^{(j)}(i) \in \mathbb{R}^{N_1 \times \ldots \times N_{j-1} \times N_{j+1} \times \ldots \times N_d}$ denotes the i-th slice of $\mathcal{X}$ along the j-th mode. That is, $\mathcal{X}^{(j)}(i) := \mathcal{X}(:_1, \ldots, :_{j-1}, i, :_{j+1}, \ldots, :_d)$, wherein: k indicates all possible mode-k indices (i.e., the indices of $[N_k]$). The reordering of mode indices is considered. Let $\mathcal{X}_\pi$ denote a tensor reordered from $\mathcal{X}$ by a set $\pi = \{\pi_1, \ldots, \pi_d\}$ of reordering functions. In this case, each $\pi_i : [N_d] \rightarrow [N_i]$ is a bijective function from the set of mode-i indices to themselves. In $\mathcal{X}_\pi$, the $(i_1, \ldots, i_d)$-th entry corresponds to the $(\pi_1(i_1), \pi_2(i_2), \ldots, \pi_d(i_d))$ entry of $\mathcal{X}$.

Frobenius norm: The Frobenius norm $[\mathcal{X}\|_F$ of $\mathcal{X}$ is defined as the squared root of the squared sum of all its entries.

$$\|\mathcal{X}\|_F = \sqrt{\sum_{(i_1, \ldots, i_d) \in [N_1] \times \ldots \times [N_d]} \mathcal{X}(i_1, \ldots, i_d)^2}.$$

Next, tensor-train decomposition (TTD) is described. The TTD decomposes a given d-order tensor X into d tensors $\mathcal{G}_1, \ldots, \mathcal{G}_d$ called TT cores. Accordingly, each entry of $\mathcal{X}$ is approximated as follows.

$$\mathcal{X}(i_1, \ldots, i_d) \approx \mathcal{G}_1^{(2)}(i_1)\mathcal{G}_2^{(2)}(i_2) \ldots \mathcal{G}_d^{(2)}(i_d),$$

wherein $\mathcal{G}_k \in \mathbb{R}^{r_{k-1} \times N_k \times r_k}$ for all of k, and $$\mathcal{G}_k^{(2)}(i) \in \mathbb{R}^{r_{k-1} \times r_k}$$

is the i-th slice of $\mathcal{G}_k$ along the second mode. In this case, $r_0$ and $r_d$ are always set to 1. In an embodiment, for simplicity, all other tensor-train (TT) ranks (i.e., $r_1, \ldots, r_{d-1}$) are unified into a single value denoted by R. A representative optimization algorithm for TTD is TTSVD, which aims to obtain $\mathcal{G}_1, \ldots, \mathcal{G}_d$ that satisfies $\|\mathcal{X} - \tilde{\mathcal{X}}_{TT}\|_F \leq \epsilon \|\mathcal{X}\|_F$ for prescribed accuracy $\epsilon$. In this case, $\tilde{\mathcal{X}}^{TT}$ is an approximated tensor by TTD. In TT-SVD, truncated SVD is applied after reshaping a tensor to a matrix. TTD is naturally used as a lossy tensor compression algorithm. The compressed results are the entries of TT-core tensors. The number of these entries is $$R^2 \sum_{k=1}^{d} N_k = O(dNR^2),$$

where N represents a maximum mode length.

Furthermore, the formal definition of the lossy tensor compression problem is provided as follows.

| Problem 1. (Lossy Compression of a Tensor) |
| --- |
| Given: a tensor $\mathcal{X} \in \mathbb{R}^{N_1 \times \ldots \times N_d}$<br>Find: the compressed data D<br>to Minimize: (1) the size of D<br><br>(2) the approximation error (e.g., $\|\mathcal{X} - \mathcal{Y}\|_F^2$),<br><br>where $\mathcal{Y}$ is the tensor reconstructed from D) |

Compression data D is composed of a set θ of parameters in the NTTD model and a set π of reordering functions.

FIG. 5 is an algorithm for describing an overall operation of lossy tensor compression. First, the computer system initializes the NTTD model θ and the reordering functions π. Next, the computer system creates a higher-order tensor $$\mathcal{X}_\pi^{folded}$$

by reordering and folding $\mathcal{X}$. Subsequently, the computer system updates the model parameters and the reordering functions in order to minimize an approximation error. The computer system repeats this process until convergence is reached, is, the that approximation error no longer exhibits significant changes. The outputs of the compression process optimize θ and π based on which each tensor entry is approximated in a logarithmic time.

In order to simplify the description, it is assumed that the input tensor $\mathcal{X}$ is already properly ordered. Thereafter, a method of initializing and updating the reordering function π is described in detail.

The computer system may provide the NTTD model for accurately approximating tensors. The computer system may accurately approximate tensor entries as a small number of parameters through the NTTD model. The computer system proposes the NTTD model in which a recurrent neural network and TTD have been integrated.

Instead of directly learning TT cores as free variables, for each $(i_1, \ldots, i_d)$-th entry of the tensor, TT cores are obtained as the output of the NTTD model that takes the mode indices of the entry as an input. The neural network denoted by θ is trained to approximate the entry as follows.

$$\mathcal{X}(i_1, \ldots, i_d) \approx \theta(i_1, \ldots, i_d) = T_1 T_2 \ldots T_d,$$

wherein $T_1 \in \mathbb{R}^{1\times R}$, $T_2 \in \mathbb{R}^{R\times R}$, ..., $T_{d-1} \in \mathbb{R}^{R\times R}$, and $T_d \in \mathbb{R}^{R\times 1}$ are TTD cores generated by θ.

For a detailed operation of the NTTD model, reference may be made to Algorithm 2 of FIG. 6 and FIG. 1. The NTTD model may consist of an embedding layer, an LSTM layer, and a linear layer. In order to encode each mode index $i_k$, first, the NTTD model may search the embedding layer $E_k$ (lines 1 and 2) for embedding $e_k$. Next, the NTTD model may supply the retrieved embedding $e_k$ to the LSTM layer and obtain hidden embedding $h_k$ for $1 \le k \le d$ (line 3). After generating a TT core $T_k$ from the obtained hidden embedding $h_k$ by using the linear layer (lines 4 to 7), the NTTD model may return the product of the generated TT core $T_k$ as an approximated entry value (line 8).

The computer system uses a model having a recurrent neural network structure in order to allow for dependency between TT cores and mode indices. However, in the NTTD model, each TT core $T_k$ is dependent on a mode-j index for all of j<k in addition to a mode-k index of a target entry (as in TTD). In an embodiment, an example in which LSTM is used has been described, and the present disclosure may also be applied to GRU and Scaled Dot-product Attention.

The NTTD model θ has the following advantages compared to the existing tensor-train decomposition (TTD).

Contextual: in the NTTD model, each TT core is different depending on all of previous mode indices in addition to a current mode index. For example, the approximation of $\mathcal{X}(2, 1, 2)$ and $\mathcal{X}(1, 2, 2)$ is considered. In the NTTD model, TT cores that are used in the third mode are different in these two cases. However, in the TTD, the same TT cores are used in the two cases because the third mode indices are identical. The NTTD model can model tensors which cannot be easily approximated although more parameters are used in the TTD because the NTTD model is contextual and non-linear. This improved expressiveness reduces reliance on structural assumptions about input tensors.

Non-linear: the NTTD model incorporates non-linear operations that are introduced by the LSTM layer, whereas the TTD does not incorporate the non-linear operations. This contributes to enhancing the expressiveness of the NTTD model, enabling the NTTD model to better approximate tensor entries.

Concise: the NTTD model shares parameters (specifically, W and b in line 6 of Algorithm 2) for different modes, which enables the NTTD model to be concise with fewer parameters than the TTD. In contrast, the TTD requires a unique TT core for each mode.

Space complexity analysis: The size of the compressed output of the NTTD model is presented in Theorem 1. The hidden dimension of LSTM and the rank of TT cores are denoted by h and R.

Theorem 1 (Size of Compressed output of NTTD model). The size (i.e., the number of parameters) of the compressed output of the NTTD model is $$O\left(h\left(h + R^2 + \sum_{i=1}^{d} N_i\right)\right),$$

which becomes $$O\left(\sum_{i=1}^{d} N_i\right)$$

when h and R are treated as constants.

Proof. The embedding layer has $$O\left(\sum_{i=1}^{d} N_i h\right)$$

parameters. The LSTM and fully connected layers have $O(h^2+hR^2)$ parameters. Accordingly, a total size is $$O\left(h\left(+R^2 + \sum_{i=1}^{d} N_i\right)\right).$$

Optimization method for θ: Problem 1, the parameters θ of the NTTD model are updated by using a mini-batch gradient descent in order to minimize a loss function, that is, $$\|x - y\|_F^2.$$

The parameters θ and the reordering functions π are alternately updated. After updating π, an optimizer (e.g., Adam) is reinitialized because a loss surface changes after reordering.

The computer system may provide a folding technique for a lightweight NTTD model. The folding technique aims to further reduce the size of the compressed output of the NTTD model, which is proportional to $$\sum_{i=1}^{d} N_i$$

according to Theorem 1, and a main idea thereof is to fold input tensors into higher-order tensors, which maintain the same number of entries, but have smaller mode lengths. The NTTD model θ aims to fit the folded tensors rather than the input tensors after the arrangement process.

Figure 2:
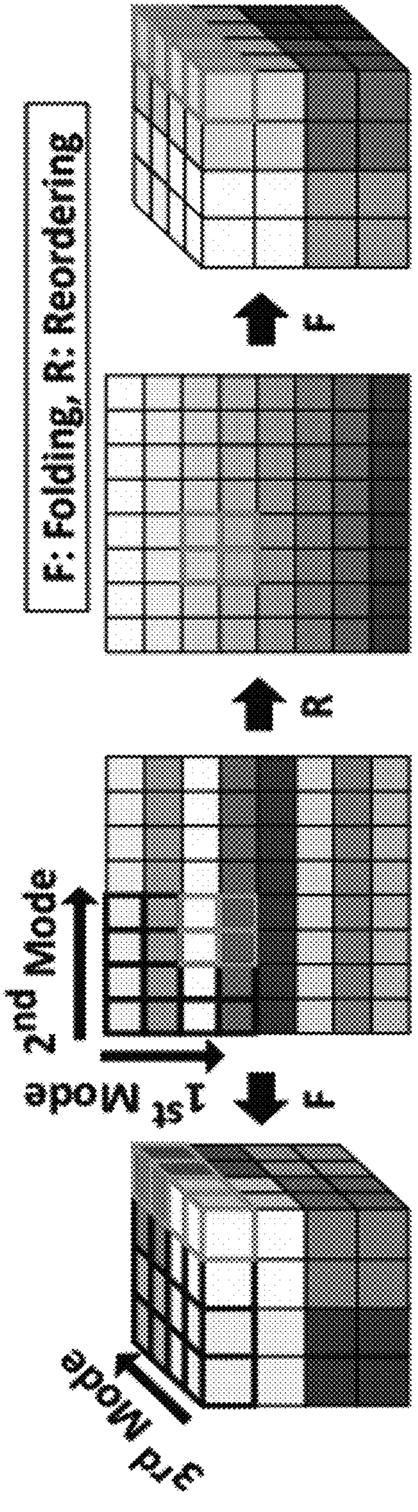
FIG. 2 is a diagram for describing an operation of folding a tensor in an embodiment.

TT matrix format: the folding technique is inspired by the TT-matrix format, and aims to fold a matrix into a tensor for reducing the number of parameters in TTD. If a matrix A having a size N×M where $$N = \prod_{k=1}^{d} n_k \text{ and } M = \prod_{k=1}^{d} m_k$$

is given, the format folds the matrix A into a d-order tensor $\mathcal{A}$ having a size $n_1m_1 \times \ldots \times n_dm_d$ (refer to an example of d=3 in FIG. 2). Accordingly, each entry of the matrix A is mapped to the entry of the tensor $\mathcal{A}$ as follows:

$$A(i, j) = \mathcal{A}(i_1 m_1 + j_1, \ldots, i_d m_d + j_d),$$

wherein $i_k \in [n_k]$ and $j_k \in [m_k]$ for each $1 \le k \le d$ satisfy $$i = \sum_{k=1}^{d} i_k \prod_{l=k+1}^{d} n_l \text{ and } j = \sum_{k=1}^{d} j_k \prod_{l=k+1}^{d} m_l.$$

The impact of the folding technique on the NTTD model is described below.

TT tensor format: the TT matrix format may be naturally extended to tensors. The TT-matrix format is extended to tensors tensor into a higher-order tensor having by folding an input smaller mode lengths. Such a process is called a TT tensor format. If a tensor $\mathcal{X}$ having a size $N_1 \times \ldots \times N_d$ is given (wherein $$N_k = \prod_{l=1}^{d'} n_{k,l} \rangle,$$

the tensor $\mathcal{X}$ is folded into a d'-order tensor $\mathcal{X}^{folded}$ having a size $$\sum_{k=1}^{d} n_{k,1} \times \ldots \times \prod_{k=1}^{d} n_{k,d'}.$$

Accordingly, mapping between the entries of the tensor $\mathcal{X}$ and the d'-order tensor $\mathcal{X}^{folded}$ is as follows.

$$\mathcal{X}\left(\sum_{k=1}^{d'}\left(i_{1,k}\prod_{l=k+1}^{d'} n_{1,l}\right), \ldots, \sum_{k=1}^{d'}\left(i_{d,k}\prod_{l=k+1}^{d'} n_{d,l}\right)\right) \rightarrow \mathcal{X}^{folded}\left(\sum_{k=1}^{d}\left(i_{k,1}\prod_{l=k+1}^{d} n_{l,1}\right), \ldots, \sum_{k=1}^{d}\left(i_{k,d'}\prod_{l=k+1}^{d} n_{l,d'}\right)\right),$$

wherein $i_{k,l} \in [n_{k,l}]$ is for both $k \in \{1, \ldots, d\}$ and $l \in \{1, \ldots, d'\}$.

In the NTTD model, a new order d' is selected so that a folded tensor has a higher order than an input tensor (i.e., d'>d). In contrast, $N_{max}$ represents a maximum mode length in the input tensor $\mathcal{X}$ while maintaining $d'=O(\log N_{max})$. This is usually feasible because the mode length of a real-world tensor is usually much larger than the order thereof. For example, a 4-order tensor having a size 256×256×256×256 may be folded into an 8-order tensor with each mode having a length of 16. It may not be always possible to construct a folded tensor that meets the above criteria while having the same number of entries as the input tensor. In a such case, the folded tensor may contain extra entries, the values of which are disregarded. In the case of real-world tensors, 2 is initially assigned to $n_{k,l}$ with respect to both $k \in \{1, \ldots, d\}$ and $l \in \{1, \ldots, d'\}$, and some of them are modified by using integers at most 5 in order to ensure that input and folded tensors have similar numbers of entries. For example, in the case of a PEMS-SF dataset (a 3-order tensor having a size 963×144×440), values assigned in the form of a d×d' matrix are as follows.

$$\begin{bmatrix} 2 & 2 & 2 & 2 & 2 & 2 & 2 & 2 & 2 & 2 \\ 2 & 2 & 2 & 2 & 2 & 5 & 1 & 1 & 1 & 1 \\ 2 & 2 & 2 & 2 & 2 & 2 & 2 & 2 & 2 & 1 \end{bmatrix},$$

This result in a 10-order tensor having a size 8×8×8×8×8×20×4×4×4×2. It is to be noted that $$\prod_{l=1}^{d'} = 1024, \prod_{l=1}^{d'} n_{2,l} = 160, \prod_{l=1}^{d'} n_{3,l} = 512$$

are close to 963, 144, and 440, respectively.

Space complexity analysis: the effect of folding on the number of parameters (i.e., the size of a compressed output) in θ is analyzed. For simplicity, it is assumed that $$n_{k,l} = \sqrt[d']{N_k}$$

is for both $k \in [d]$ and $l \in [d']$. According to Theorem 1, the number of parameters of the NTTD model of the original X is as follows.

$$O\left(\sum_{k=1}^{d}\prod_{l=1}^{d\prime} n_{k,l}\right) = O(N_1 + \ldots + N_d),$$

If h and R are treated as constants, the number of parameters of the NTTD model of $\mathcal{X}^{folded}$ is as follows.

$$O\left(\sum_{l=1}^{d\prime}\prod_{k=1}^{d} n_{k,l}\right) = O\left(d'^{d'}\sqrt{N_1 \ldots N_d}\right),$$

wherein the number of parameters of the NTTD model is significantly smaller than that of $O(N_1 + \ldots + N_d)$ in the NTTD model of the original tensor due to $$O\left(d' \cdot \sqrt[d']{\prod_{k=1}^{d} N_k}\right) \in o(N_{max}).$$

In this case, $N_{max}$ is a maximum mode length of $\mathcal{X}$. This is because $d'=O(\log N_{max})$, d'>d, and thus $$d' = O\left(d' \cdot \sqrt[d']{\prod_{k=1}^{d} N_k}\right) = O(N_{max}^{e} \log N_{max})$$

for some e<1. If R and h are considered, the space complexity is as follows according to Theorem 1.

$$O\left(h\left(h+R^2+d^{d'}\sqrt[d']{N_1 \ldots N_d}\right)\right).$$

The computer system may provide a reordering technique for making a folded tensor more suitable. Essentially, mode indices are reordered in the mode indices of input tensors before folding so that entries having similar values are placed close to each other by sharing their mode indices in the folded tensor. This arrangement improves the ability of the NTTD model θ that is suitable for the folded tensor more effectively because the NTTD model θ generates TT cores based on the mode indices of target entries that serve as an input for the NTTD model.

In the example of FIG. 2, the closer two entries are located in the original tensor, the more indices the two entries tend to share in the folded tensor. Specifically, entries in a black region share only a first mode index in the folded tensor. Adjacent entries in a gray region share both the first and second mode indices in the folded tensor. In the NTTD model θ, in order to approximate two entries, it is important to note that k-th TT cores $T_k$ in Equation (3) are the same if the first k indices are the same. Consequently, two TT cores are shared for the entries in the gray region. Therefore, the closer two entries are located in the original tensor, the more inputs and TT cores of the NTTD model θ are likely to share for these entries. Due to such a property, positioning similar entries close to each other helps the NTTD model θ to easily approximate entries more accurately. Mode indices are relocated by reordering the mode indices in the input tensors. As illustrated in the example of FIG. 2, a gray region includes more similar entries after reordering.

The mode-index reordering is accomplished by learning the reordering functions π. The computer system alternately updates the NTTD model θ and the reordering functions π. Initialization and update procedures for the reordering functions π are described. It needs to note that mode-index ordering is associated with increasing smoothness.

Initializing orders: the set of reordering functions π is initialized by using a surrogate loss function. For all k, reordering mode-k indices (i.e., optimizing $\pi_k$) is formulated as.

$$\min_{\pi_k} \sum_{i=1}^{N_k-1} \left(\left\|\mathcal{X}^{(k)}(\pi_k(i)) - \mathcal{X}^{(k)}(\pi_k(i+1))\right\|_F\right),$$

wherein $\mathcal{X}^{(k)}(i)$ is the i-th slice of $\mathcal{X}$ that follows a k-th mode. It is to be noted that minimizing Equation (6) makes adjacent slices similar.

The problem in Equation (6) may be reduced to a Metric Travelling Salesman Problem (TSP). It is supposed that each node represents a slice of a tensor and each pair of nodes forms an edge having the same weight as that of the Frobenius norm of a difference between their slices. Thereafter, the optimal solution of the TSP in the resulting complete graph may be used to minimize Equation (6). However, since computing is NP-hard, a 2-approximation solution is obtained based on the fact that the Frobenius norm satisfies triangle inequality instead. Thereafter, an edge having the largest weight is deleted from the obtained solution. Each i-th node in the resulting path is set as $\pi_k(i)$.

Updating orders based on θ (Algorithm 3 in FIG. 7): after the NTTD model θ is updated, the set of reordering functions m is updated based on the updated NTTD model θ and the loss function in Problem 1. This update step is described in Algorithm 3. A tensor that is reordered in $\mathcal{X}$ is denoted by using $\mathcal{X}_\pi$ for each reordering function π. For each k-th mode, $[N_k/2]$ disjoint candidate pairs of mode-k indices (lines 17 to 18) are considered. A process of obtaining the candidate pairs is described below. For each pair (i, i') of mode indices, corresponding slices $$\mathcal{X}_\pi^{(k)}(i) \text{ and } \mathcal{X}_\pi^{(k)}(i')$$

are considered. If the loss function is reduced in Problem 1, the values of $\pi_k(i)$ and $\pi_k(i')$ (lines 22 to 24) are swapped. Since the pairs are disjoint, changes in the loss may be computed and Tik may be updated in parallel by using GPUS.

In the above process, if the pairs are swapped, each pair is composed so that similar slices tend to be located nearby in $\mathcal{X}_\pi$. Such pairs are found by using locality-sensitivity hashing (LSH) for Euclidean distance. Half of the indices in each mode are sampled, and corresponding slices are vectorized as points in a high-dimensional space. The vectorized slices are projected onto a random vector (lines 6 to 10), and the projected points are evenly divided to create buckets. Thereafter, two points are repeatedly selected in the same bucket. Assuming that corresponding mode indices are $i_1$ and $i_2$, two pairs $(i_1, i_2 \oplus 1)$ and $(i_1 \oplus 1, i_2)$ are added as candidate pairs. In this case, ⊕ denotes an XOR operation (lines 17 to 18). Such an approach aims to locate indices corresponding to similar slices. The remaining mode indices are paired randomly (lines 19 to 21).

According to an embodiment, a compressed output size, an entry-reconstruction speed, and a compression speed are theoretically analyzed. For simplicity, it is assumed that all the mode sizes of the input tensors $\mathcal{X} \in \mathbb{R}^{N_1 \times \cdots \times N_d}$ are powers of 2 (i.e., $n_{l,k} \in \{1, 2\}$ for all of $l \in \{1, \ldots, d\}$ and $k \in \{1, \ldots, d'\}$). $N_{max}$ is used to denote a maximum size of modes in $\mathcal{X}$, and h and R are used to denote a hidden dimension and TT rank of the NTTD model.

Size of compressed outputs: the space complexity of outputs produced by the NTTD model in Theorem 2 is presented. It is important to note that the complexity is much lower than $$O\left(\prod_{i=1}^{d} N_i\right)$$

of the original tensor and may be lower than $$O\left(R\sum_{i=1}^{d} N_i\right) \text{ of } TTD \text{ and}$$

$$O\left(R\sum_{i=1}^{d} N_i\right) \text{ of } CP \text{ decomposition } (CPD),$$

especially when R have large values.

Theorem 2 (size of compressed outputs). The size of the compressed output D=(θ,π) produced by Algorithm 1 is $$O\left(h\left(2^d+h+R^2\right)+\sum_{i=1}^{d} N_i \log N_i\right).$$

Proof. The NTTD model shares the embedding layer across different modes of $$x_{\pi}^{folded},$$

and the largest mode size of $$x_{\pi}^{folded}$$

is $2^d$. Accordingly, the embedding layer of θ has $O(h2^d)$ parameters. The number of parameters of each linear layer is proportional to the product of an input dimension and an output dimension. Accordingly, the number of parameters of the LSTM and fully connected layers is $O(h^2+hR^2)$. For each mode i, the number of all possible orderings of $\pi_i$ is $N_i!$. Accordingly, in order to store one of the orders, $O(\log N_i!) \in O(N_i \log N_i)$ bits are required. Accordingly, a total size of compressed outputs is $$O\left(h\left(2^d + h + R^2\right) + \sum_{i=1}^{d} N_i \log N_i\right).$$

Speed of reconstruction: Another important aspect of a compression algorithm is the speed of reconstruction. Theorem 3 formalizes the reconstruction speed for the output of the NTTD model. While the complexity is higher than $O(dR^2)$ of TTD or $O(dR)$ of CPD, it is only logarithmic in mode lengths.

Theorem 3 (Reconstruction Speed). If the output D=(θ, π) of Algorithm 1 us given, time $O((d+h^2+hR^2)\log N_{max})$ is taken to approximate the value of an input tensor entry (i.e., Algorithm 2 on $\mathcal{X}_\pi$).

Proof. For each entry of $\mathcal{X}$, time O(d) is required to earn the mode indices in $\mathcal{X}_\pi$. Computing the mode indices in $$\mathcal{X}_{\pi}^{folded}$$

requires $O(d \log N_{max})$ time because all $i_{kl}$ in Equation (4) needs to be computed where k ranges from 1 to d and l ranges from 1 to $d'=O(\log N_{max})$. In order to process the inputs through the embedding layer and the LSTM layer in θ, time $O(h^2 \log N_{max})$ is required. If the order of computations is optimized, the time complexity of computing TT cores with the fully connected layers is $O(hR^2 \log N_{max})$, and that of computing products of the TT cores is $O(R^2 \log N_{max})$. Therefore, the total time complexity of approximating each entry is $O((d+h^2+hR^2)\log N_{max})$.

Compression speed: the speed of the compression process is analyzed.

Theorem 4 (compression speed). The time complexity of Algorithm 1 including T update steps is $$O\left(\left(Td\left(d + h^2 + hR^2\right)\log N_{max} + \sum_{i=1}^{d} N_i\right)\prod_{i=1}^{d} N_i\right), \text{ wherein } \prod_{i=1}^{d} N_i$$

is the number of tensor entries.

Proof Sketch. Initializing all reordering functions I requires time $$O\left(\left(\sum_{i=1}^{d} N_i\right)\cdot\left(\prod_{i=1}^{d} N_i\right)\right).$$

Updating θ and π once (i.e., lines 4 and 5) requires time $$O\left(d\left(d + h^2 + hR^2\right)\prod_{i=1}^{t} N_i \log N_{max}\right).$$

Connection to actual running time: time complexity is confirmed by measuring an actual running time for compression and reconstruction. In practice, a term $$\prod_{i=1}^{d} N_i,$$

which corresponds to the number of entries, is much larger and also increases much faster than all other terms, and thus the compression time increases nearly linearly.

Memory requirements: The complexity of a memory space required for compression by the NTTD model does not exceed combined memory requirements for a mini-batch, the compressed output, and the reordering functions.

Theorem 5 (Memory Requirements for Compression). A memory space $$O\left(Bd + h\left(2^d + B\left(h + R^2\right)\log N_{max}\right) + \sum_{i=1}^{d} N_i\right)$$

is required for Algorithm 1. In this case, B is the number of tensor entries in the mini-batch.

Figure 3:
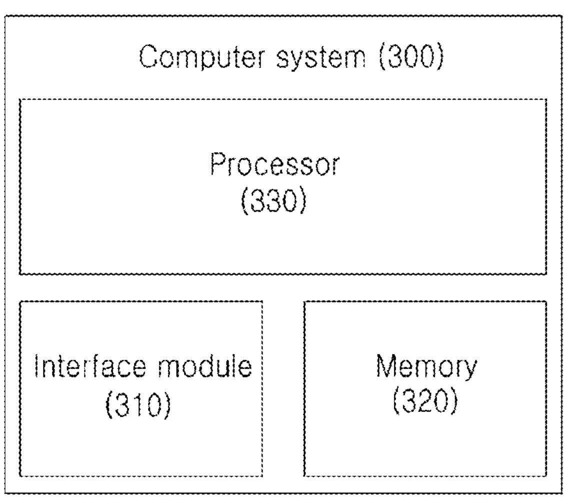
FIG. 3 is a diagram illustrating a computer system in an embodiment.

FIG. 3 is a diagram illustrating a computer system in an embodiment.

A computer system 300 may include at least one of an interface module 310, memory 320, or a processor 330. In some embodiments, at least one of the components of the computer system 300 may be omitted, and at least another component may be added to the computer system 300. In some embodiments, at least two of the components of the computer system 300 may be implemented with a single integrated circuit.

The interface module 310 may provide an interface for the computer system 300. According to an embodiment, the interface module 310 includes a communication module. The communication module may perform communication with an external device. The communication module may establish a communication channel between the computer system 300 and the external device, and may perform communication with the external device through the communication channel. The communication module may include at least one of a wired communication module or a wireless communication module. The wired communication module is connected to the external device through wires, and may communicate with the external device through wires. The wireless communication module may include at least any one of a short-distance communication module or a long-distance communication module. The short-distance communication module may communicate with the external device by using a short-distance communication method. The long-distance communication module may communicate with the external device by using a long-distance communication method. In this case, the long-distance communication module may communicate with the external device over a wireless network. According to another embodiment, the interface module 310 may include at least one of an input module or an output module. The input module may input a signal to be used for at least one component of the computer system 300. The input module may include at least any one of an input device configured to enable a user to directly input a signal to the computer system 300, a sensor device configured to generate a signal by detecting a surrounding environment, or a camera module configured to generate image data by capturing an image. The output module may include at least one of a display module for visually displaying information or an audio module for outputting information in the form of an audio signal.

The memory 320 may store various data used by at least one component of the computer system 300. For example, the memory 320 may include at least any one of a volatile memory or a non-volatile memory. The data may include at least one program and input data or output data related to the program. The program may be stored in the memory 320 as software including at least one instruction.

The processor 330 may control at least one component of the computer system 300 by executing the program of the memory 320. Accordingly, the processor 330 may perform data processing or an operation. In this case, the processor 330 may execute an instruction stored in the memory 320.

The processor 330 may input, to the NTTD model, the mode indices of a target entry to be reconstructed, and may obtain TT cores from the mode indices of the target entry to be reconstructed through the NTTD model. The processor 330 may perform a process of folding a tensor into a tensor having an order of a preset reference or more in order to reduce the compression size of the tensor. The processor 330 may reorder the tensor before the folding.

Figure 4:
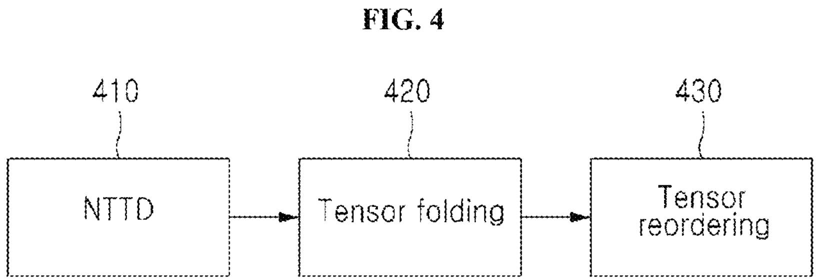
FIG. 4 is a diagram for describing an NTTD method in an embodiment.

FIG. 4 is a diagram for describing a neural tensor-train decomposition (NTTD) method in an embodiment.

The computer system may perform operations, including NTTD 410, tensor folding 420, and tensor reordering 430.

In the NTTD 410, the computer system may use a recurrent neural network (e.g., LSTM) in order to improve the expressiveness of tensor-train decomposition (TTD). The computer system may construct a TTD model based on a recurrent neural network. The computer system may input the mode index (location permutation/array) of a target entry (element) to the NTTD model. The computer system may output a matrix that constitutes TTD through the NTTD model based on a recurrent neural network. Accordingly, a compressed tensor may be considered as a recurrent neural network. In this case, each matrix that constitutes the TTD may reconstruct an entry more accurately compared to common TTD because each matrix is determined by considering a location in several dimensions of the target entry.

Furthermore, in the tensor folding 420, the computer system may perform a process of folding the tensor into a higher-order tensor in order to additionally reduce the compression size. The number of parameters of the NTTD model increases in proportion to the sum of dimensions of the tensor. If the tensor is folded into a higher-order tensor, the sum of dimensions of the tensor may be reduced. For example, a 2-D matrix in which the length of one side is 32 may be folded into a 5-dimension matrix in which the length of one side is 4. In this case, the sum of dimensions is reduced from 64 to 20.

Finally, in the tensor reordering 430, the computer system may reorder the tensor before the folding in order to further improve the reconstruction accuracy of the NTTD model. The closer a specific entry is located in the tensor before folding, the more similar the location permutation in a folded tensor used as input to the NTTD model. Accordingly, matrices that are output by the NTTD model become similar, and reconstruction values become similar. Therefore, if the tensors are reordered so that similar values are closely located, the reconstruction error of the NTTD model is also reduced. Arrangement information for reconstructing a reordered tensor into the original tensor, along with the parameters of the NTTD model, is also considered as the compressed results of the tensor.

According to an embodiment, the present disclosure may be used in all fields in which tensors are used. For example, weather data that is measured at an air quality monitoring station, the record of each stock in a stock market, and feature data of video may be expressed as tensors. A compression technique for such tensors may be usefully used because the size of the tensor continues to be increased over time. Network traffic can be reduced when tensor data is transmitted through the Internet. A large tensor may be stored in small memory equipment, such as a smartphone or a laptop.

Parameters of an artificial neural network are basically expressed as tensors. A large language model that is recently spotlighted with excellent performance requires memory of several Giga bytes in storing all parameters on the basis of ChatGPT by OpenAI. This size is a size which cannot be stored in most of electronic devices that are used by common users. If such a large artificial neural network can be compressed and stored even in an electronic device having a low memory capacity and only a necessary part thereof can be reconstructed and used, a computational load and Internet traffic for a central server can be greatly reduced.

Companies to which the present technology may be applied include companies having large tensor data, such as Netflex, Meta, the You Tube, and Twitch, companies that produce electronic devices having low memory capacities, such as Samsung, Apple, and Huawei, and companies that provide services using large artificial neural networks, such as Google and OpenAI.

The aforementioned device may be implemented with a hardware component, a software component and/or a combination of a hardware component and software component. For example, the device and component described in the embodiments may be implemented by using one or more general-purpose computers or special-purpose computers, such as a processor, a controller, an arithmetic logic unit (ALU), a digital signal processor, a microcomputer, a field programmable gate array (FPGA), a programmable logic unit (PLU), a microprocessor, or any other device capable of executing or responding to an instruction. The processing device may perform an operating system (OS) and one or more software applications executed on the OS. Furthermore, the processing device may access, store, manipulate, process and generate data in response to the execution of software. For convenience of understanding, one processing device has been illustrated as being used, but a person having ordinary knowledge in the art may understand that the processing device may include a plurality of processing elements and/or a plurality of types of processing elements. For example, the processing device may include a plurality of processors or one processor and one controller. Furthermore, another processing configuration, such as a parallel processor, is also possible.

Software may include computer program, a code, an instruction or a combination of one or more of them and may configure a processing device so that the processing device operates as desired or may instruct the processing devices independently or collectively. The software and/or the data may be embodied in any type of machine, a component, a physical device, virtual equipment, a computer storage medium, or a device in order to be interpreted by the processing device or to provide an instruction or data to the processing device. The software may be distributed to computer systems connected over a network and may be stored or executed in a distributed manner. The software and the data may be stored in one or more computer-readable recording media.

The method according to an embodiment may be implemented in the form of a program instruction executable by various computer means, and may be stored in a computer-readable medium. The computer-readable recording medium may include a program instruction, a data file, and a data structure alone or in combination. The program instruction recorded on the medium may be specially designed and constructed for an embodiment, or may be known and available to those skilled in the computer software field. Examples of the computer-readable recording medium include magnetic media such as a hard disk, a floppy disk, and a magnetic tape, optical media such as CD-ROM and a DVD, magneto-optical media such as a floptical disk, and hardware devices specially configured to store and execute a program instruction, such as ROM, RAM, and flash memory. Examples of the program instruction include not only machine language code produced by a compiler, but a high-level language code which may be executed by a computer using an interpreter, etc.

As described above, although the embodiments have been described in connection with the limited embodiments and the drawings, those skilled in the art may modify and change the embodiments in various ways from the description. For example, proper results may be achieved although the aforementioned descriptions are performed in order different from that of the described method and/or the aforementioned components, such as a system, a structure, a device, and a circuit, are coupled or combined in a form different from that of the described method or replaced or substituted with other components or equivalents thereof.

Accordingly, other implementations, other embodiments, and the equivalents of the claims fall within the scope of the claims.

The embodiments of the disclosure in which an exclusive property or privilege is claimed are defined as follows:

1. A lossy tensor compression method performed by a computer system, comprising:
- inputting, to a neural tensor-train decomposition (NTTD) model, mode indices of a target entry to be reconstructed; and
- obtaining tensor-train (TT) cores from the mode indices of the target entry to be reconstructed through the NTTD model.

2. The lossy tensor compression method of claim 1, wherein the NTTD model is constructed for tensor-train decomposition (TTD) by using a recurrent neural network.

3. The lossy tensor compression method of claim 2, wherein the NTTD model is constructed through:
- searching an embedding layer for embedding in order to encode each mode index;
- obtaining hidden embedding for the searched embedding through an LSTM layer;
- generating the TT cores from the obtained hidden embedding through a linear layer; and
- learning to return an approximated entry value through a product of the generated TT cores.

4. The lossy tensor compression method of claim 1, wherein the obtaining of the hidden embedding comprises searching for compression data composed of parameters of the NTTD model and reordering functions.

5. The lossy tensor compression method of claim 1, wherein the obtaining of the hidden embedding comprises:
- initializing parameters of the NTTD model and reordering functions;
- generating a tensor having an order of a preset reference or more by reordering an order of input tensors and folding the input tensors; and
- updating the parameters of the NTTD model and the reordering functions in order to minimize an approximation error.

6. The lossy tensor compression method of claim 5, wherein the obtaining of the hidden embedding further comprises performing a process of folding the input tensor into a tensor having the order of the preset reference or more in order to reduce a compression size of the tensor.

7. The lossy tensor compression method of claim 6, wherein the obtaining of the hidden embedding further comprises reordering the input tensors before performing the process of folding.

8. The lossy tensor compression method of claim 7, wherein the obtaining of the hidden embedding comprises reordering mode indices of the input tensors so that entries having similar values are located closely by sharing the mode indices of the folded tensor.

9. A computer-readable recording medium in which a computer program for executing a lossy tensor compression method performed by a computer system has been stored,
- wherein the lossy tensor compression method comprises:
- inputting, to a neural tensor-train decomposition (NTTD) model, mode indices of a target entry to be reconstructed; and
- obtaining tensor-train (TT) cores from the mode indices of the target entry to be reconstructed through the NTTD model.

10. A computer system comprising:
- memory; and
- a processor connected to the memory and configured to execute at least one instruction stored in the memory,
- wherein the processor inputs, to a neural tensor-train decomposition (NTTD) model, mode indices of a target entry to be reconstructed and obtains tensor-train (TT) cores from the mode indices of the target entry to be reconstructed through the NTTD model.

* * * * *